US009958512B2

(12) United States Patent
Zhong (10) Patent No.: US 9,958,512 B2
(45) Date of Patent: May 1, 2018

(54) LOW-POWER MAGNETIC RESISTANCE SWITCH SENSOR (71) Applicant: MultiDimensional Technology Co., Ltd., Zhangjiagang (CN)

(72) Inventor: Xiaojun Zhong, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 72 days.

(21) Appl. No.: 14/778,303

(22) PCT Filed: Mar. 20, 2014

(86) PCT No.: PCT/CN2014/073801
§ 371 (c)(1),
(2) Date: Sep. 18, 2015

(87) PCT Pub. No.: WO2014/146594
PCT Pub. Date: Sep. 25, 2014

(65) Prior Publication Data
US 2016/0282426 A1  Sep. 29, 2016

(30) Foreign Application Priority Data

Mar. 20, 2013 (CN) .......................... 2013 1 0090198
Mar. 25, 2013 (CN) .......................... 2013 1 0097268

(51) Int. Cl.
G01R 33/02 (2006.01)
G01R 33/09 (2006.01)
H03K 17/95 (2006.01)

(52) U.S. Cl.
CPC ......... *G01R 33/098* (2013.01); *G01R 33/091* (2013.01); *G01R 33/093* (2013.01); *H03K 17/9517* (2013.01)

(58) Field of Classification Search
CPC ... G01R 33/098; G01R 33/091; G01R 33/093
(Continued)

(56) References Cited

U.S. PATENT DOCUMENTS 4,857,841 A    8/1989  Hastings et al.
5,491,475 A *  2/1996  Rouse ................... G08G 1/042
                                                   324/244
(Continued)

FOREIGN PATENT DOCUMENTS

CN      2501256 Y    7/2002
CN    101802633 A    8/2010
(Continued)

OTHER PUBLICATIONS

"International Application No. PCT/CN2014/073801, International Search Report mailed Jun. 5, 2014", (Jun. 5, 2014), 5 pgs.
(Continued)

Primary Examiner — Reena Aurora
(74) Attorney, Agent, or Firm — Schwegman Lundberg & Woessner, P.A.

(57) ABSTRACT

Disclosed in the present invention is a low-power magnetoresistive switch sensor, comprising an internal reference voltage circuit, a multiplexer, a magnetoresistive bridge circuit, a comparison circuit, a voltage stabilization circuit, a digital control circuit, and a digital output circuit; one end of the internal reference voltage circuit is grounded while the other end of the internal reference voltage circuit is connected to the output end of the voltage stabilization circuit; the comparison circuit comprises one or more comparators, one end of the comparison circuit is electrically connected with the voltage stabilization circuit while the other end is grounded, the comparison circuit is provided with one or more input ends and one or more output ends, and the one or more output ends of the comparison circuit are electrically connected with one input ends of the digital control circuit; one end of the magnetoresistive bridge circuit is electrically connected with the output end of the voltage stabilization circuit while the other end is grounded, and the output end of the magnetoresistive bridge circuit is
(Continued)

electrically connected with one input end of the comparison circuit. The low-power magnetoresistive switch sensor has the advantages of high sensitivity, low power consumption, high frequency response, small size, and excellent thermal characteristics.

20 Claims, 8 Drawing Sheets

(58) Field of Classification Search
USPC .......................................................... 324/252
See application file for complete search history.

(56) References Cited

U.S. PATENT DOCUMENTS

| 5,668,331 | A | * | 9/1997 | Schintag | ............... | G01D 5/345 |
|---|---|---|---|---|---|---|
| | | | | | | 324/207.2 |
| 8,362,765 | B2 | | 1/2013 | Butzmann et al. | | |
| 2004/0027772 | A1 | | 2/2004 | Bilotti et al. | | |
| 2006/0197522 | A1 | | 9/2006 | Bilotti et al. | | |
| 2009/0079411 | A1 | | 3/2009 | Ariyama | | |
| 2010/0026281 | A1 | | 2/2010 | Nishikawa | | |
| 2010/0045268 | A1 | | 2/2010 | Kilian | | |
| 2012/0280681 | A1 | | 11/2012 | David et al. | | |
| 2015/0091560 | A1 | | 4/2015 | Deak et al. | | |

FOREIGN PATENT DOCUMENTS

| CN | 102185600 | | 9/2011 |
|---|---|---|---|
| CN | 102298125 | | 12/2011 |
| CN | 102565727 | A | 7/2012 |
| CN | 102790613 | A | 11/2012 |
| CN | 203119864 | U | 8/2013 |
| JP | 04-133221 | A | 5/1992 |
| JP | 2011187211 | | 9/2011 |
| WO | WO-2014/146594 | | 9/2014 |
| WO | WO 2014/146594 | A1 | 9/2014 |

OTHER PUBLICATIONS

International Application Serial No. PCT/CN2014/073801, International Search Report mailed Jun. 5, 2014, (w/ English Translation), 5 pgs.
European Application No. 14768979.8, Extended European Search Report dated Oct. 12, 2016 (Oct. 12, 2016), 9 pgs.

* cited by examiner

LOW-POWER MAGNETIC RESISTANCE SWITCH SENSOR

PRIORITY CLAIM TO RELATED APPLICATIONS

This application is a U.S. national stage application filed under 35 U.S.C. § 371 from International Application Serial No. PCT/CN2014/073801, which was filed 20 Mar. 2014, and published as WO2014/146594 on 25 Sep. 2014, and which claims priority to Chinese Application No. 201310090198.2, filed 20 Mar. 2013, and to Chinese Application No. 201310097268.7, filed 25 Mar. 2013, which applications and publication are incorporated by reference as if reproduced herein and made a part hereof in their entirety, and the benefit of priority of each of which is claimed herein.

TECHNICAL FIELD

The present invention relates to the technical field of sensors, and more particularly to a low-power magnetoresistive switch sensor.

BACKGROUND

Magnetic switch sensors are widely used in consumer electronics, white goods, utility-meters (electricity meter, water meter, gas meter), automotive, and industrial applications. Presently mainstream magnetic switch sensors utilize Hall sensors and AMR (anisotropic magnetoresistive) sensors. For the Applications in consumer electronics and utility meters, Hall switch sensors and AMR switch sensors have power consumption of up to a few microamps. This is obtained at the expense of operating frequency. Hall switch sensors and AMR switch sensors are operate at a frequency of a dozen or so Hz with a switch point in the range of tens of gauss. In the automobile and other industrial fields requiring high frequency operation, Hall switch sensors and AMR switch sensors consume power on the order of mA at the kHz level.

In recent years, a new type of magnetoresistive sensor utilizing magnetic tunnel junction (MTJ) has found application in industrial fields. These combine magnetic multilayers with the tunneling magnetoresistance effect. The electrical resistance of the magnetic multilayer depends on the magnitude and the orientation of the external magnetic field. In the low-power consumption fields, such as the consumer electronics and utility-meters, the MTJ sensors operating at a frequency of a dozen Hz with a switch point of tens of gauss. In the automobile and other industrial fields requiring high frequency operation, the MTJ sensors consume power on the order of microamps at the MHz level.

Some technical descriptions of magnetic switch devices are known in the art. U.S. Patent No. 2010/0026281 A1 discloses a gradiometer comprising two sensors for measuring location and speed of magnetic targets. The use of MTJ elements in magnetic switch sensors is described by Chinese patent application #201110125153.5. These patent applications are incorporated by reference.

The power consumption for the existing switch sensors is high in both sleep working states, and they have low operating frequency. A need therefore exists for a switch sensor with high sensitivity, high frequency response, small volume, and low power consumption in sleep and working states.

SUMMARY OF THE INVENTION

The purpose of the present invention is to provide a magnetoresistive sensor switch.

The magnetoresistive switch sensor of the present invention includes an internal voltage reference circuit, a multiplexer, a magnetoresistive bridge circuit, a comparison circuit, a power supply, a voltage reference circuit, digital control circuits, and digital output circuits;

Said reference voltage circuit is connected to ground at one end, the other end is electrically connected to the output terminal of the power supply regulator circuit;

Said comparison circuit comprises one or more comparators, one end of which is electrically connected to said power regulator circuit, and the other end to ground, said comparison circuit has one or more inputs and one or a plurality of outputs, one or more of said comparison circuit output terminals are electrically connected to an input terminal said digital control circuit;

The magnetoresistive bridge circuit is electrically connected to the power regulator circuit and to ground, and the magnetoresistive bridge circuit output is connected to one input of the comparator circuit;

The multiplexer is controlled by the digital control circuit, said multiplexor determining which of the many said outputs of said reference voltage circuit are electrically connected to one of said comparator circuit inputs;

The digital control circuit executes operations based on internal logic states and input signals changes, and it is electrically connected to the multiplexer and the digital output circuit.

Preferably, a Low Pass Filter circuit is connected between said reference voltage circuit, said magnetoresistive bridge circuit and said comparator circuit, the inputs of said Low Pass Filter circuit is connected to said outputs of said MR bridge circuit and said outputs of said reference voltage circuit, the outputs of said Low Pass Filter circuit is connected to said inputs of said comparator circuit, it is used to attenuate the voltages above a cut-off frequency.

Preferably, the power regulator circuit output voltage $V_{Bias}$ is less than the supply voltage.

Further, the comparator circuit comprises one or more comparator power switches that determine which of current source are connected to the power terminals of said comparator circuit, said current sources connected also to said power regulator circuit, said comparator power switches being controlled by said digital control circuit.

Preferably, the digital control circuit is one part of digital control system.

Further, the digital control system comprises a set of logical operating modes, and applied magnetic field trigger conditions, wherein the digital control system creates magnetic field-dependent output having the character of the bipolar switch, unipolar switch, or omnipolar switch.

Preferably, the magnetoresistive bridge circuit comprises the first MR element and the second MR element, the first MR element and the second MR element are connected electrically to form one Push-pull half bridge.

Further, the first MR element and said second MR element respectively comprises one or more MTJ elements in series or/and in parallel.

Further, the sensitive direction of said push-pull half bridge is parallel to the magnetic moment direction of the pinned layer of said first magnetoresistive element and second magnetoresistive element.

Preferably, the digital output stage circuit comprises a latch and driver circuit and the output stage, the input of said latch and driver circuit is connected to the output of said digital control circuit, the output of said latch and driver circuit is connected to the output stage.

The present invention has the following beneficial effects:

The switch sensor of the present invention utilizes MTJ elements as sensor components in order to sense the approach of ferromagnetic material, thereby providing high sensitivity, low power consumption, high frequency response, and good thermal characteristics.

BRIEF DESCRIPTION OF THE DRAWINGS

In order to more clearly illustrate the implementation of technical solutions to the invention, a brief introduction to the relevant diagrams along with technical details are provided below. Obviously, the following descriptions of the diagrams illustrate only some of the practical configurations of the present invention. For a person of ordinary skill in this field, they can easily arrive at other useful configurations from our described diagrams without any creative thinking.

DETAILED DESCRIPTION

The following diagrams illustrate the implementation of technical solutions of the present invention, with specific examples of the present invention described clearly and completely.

Implementation Example

Figure 1:
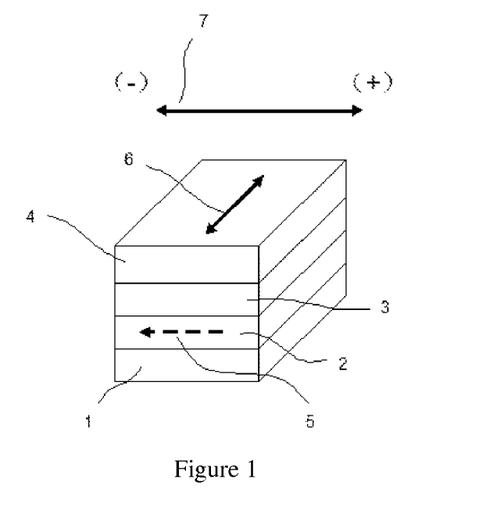
FIG. 1 is a schematic view of a prior art MTJ element material stack.

As shown in FIG. 1, the MTJ magnetic tunnel junction structure is made by the nano-scale multilayers: the anti-ferromagnetic layer 1, a magnetic pinning layer 2, non-magnetic oxide layer 3, the magnetic free layer 4. The orientation of the magnetic moment 5 of the magnetic pinning layer 2 is perpendicular or has an angle to the orientation of the magnetic moment 6 of the magnetic free layer 4. The orientation of the magnetic moment 6 of the magnetic free layer 4 depends on the magnitude and the orientation of the external magnetic field 7. The mechanism for the MTJ structure is shown below: the resistance of the MTJ structure depends on the angle between the orientation of the magnetic moment 5 of the magnetic pinning layer 2 and the orientation of the magnetic moment 6 of the magnetic free layer 4. When the orientation of the magnetic moment 6 of the magnetic free layer 4 rotates under the external magnetic field 7, the resistance of the structure also changes.

Figure 2:
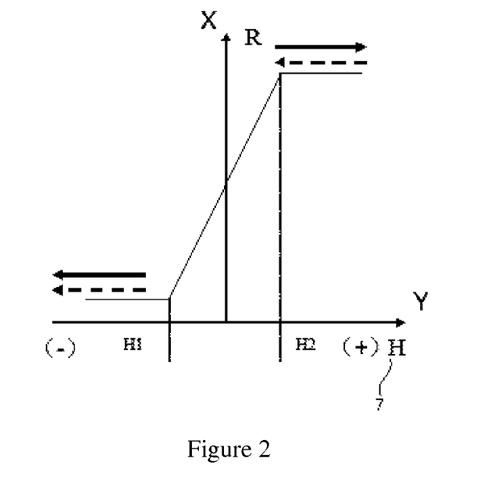
FIG. 2 is a plot showing the relationship between the applied magnetic field and the resistance of the prior art MTJ element.

Shown in FIG. 2, when the external magnetic field 7 is parallel with the magnetic pinned layer 2 and the applied magnetic field strength is greater than H1, the orientation of the magnetic free layer 4 is also parallel with the external magnetic field 7. Therefore, it is parallel with the magnetic pinning layer 2. Under this circumstance, the MTJ structure demonstrates the minimum resistance. When the external magnetic field 7 is anti-parallel with the magnetic pinned layer 2 and the applied magnetic field strength is greater than H2, the orientation of the magnetic free layer 4 is also anti-parallel with the external magnetic field 7. Therefore, it is anti-parallel with the magnetic pinning layer 2. Under this circumstance, the MTJ structure demonstrates the maximum resistance. The magnetic field range between H1 and H2 is the measuring range of the MTJ.

The present invention uses the following ways or a combination of the following ways to bias the direction of the magnetic moment of the magnetic free layer. The following orientation of the magnetic moment of the magnetic free layer is perpendicular to or at an angle and magnetic with that of the magnetic pinning layer: With the deposition of a thin layer of anti-ferromagnetic material above or underneath the free layer, the direction of the magnetic moment is biased by the exchange coupling; The direction of the magnetic moment is biased by the Neel coupling between the magnetic free layer and the magnetic pinning layer; By the integration of the current coil with the sensor, the direction of the magnetic moment is biased by the following current in the same direction; The direction of the magnetic moment is biased by the permanent magnetic nearby.

Figure 3:
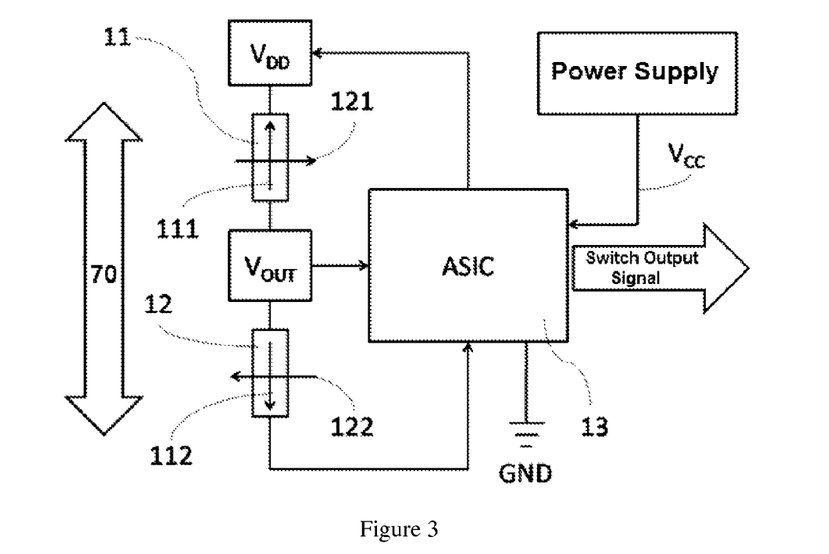
FIG. 3 is a plot illustrating an integrated circuit combined with a push-pull half-bridge sensor of the prior art.

A shown in FIG. 3, the prior art push-pull magnetoresistive switch sensor comprises a first magnetoresistive element 11, a second magnetoresistive element 12 and an ASIC (Application Specific Integrated Circuit) chip 13. Wherein the ASIC and the first magnetoresistive element 11 and the second magnetoresistive element form an assembly, the two magnetoresistive elements, 11 and 12, are also connected to form a push-pull half-bridge circuit. The sensing elements of 11 and 12 consist by one or more MTJ magnetoresistive elements in series and/or parallel. The MTJ magnetoresistive element is a multilayer nano scale structure including a ferromagnetic free layer and a ferromagnetic pinned layer. The magnetic moments of the free layers inside two MTJ elements, 121 and 122 are set to the anti-parallel orientation. Similarly, the magnetic moments of the pinning layers inside two MTJ elements, 111 and 112 are set to the anti-parallel orientation. The magnetic moments of the pinned layer 111 and pinned layer 112 are rotated perpendicularly to the direction of the magnetic moments of the free layer 121 and free layer 122 for each MTJ element. The sensing direction 70 of the pull-push half-bridge circuit is parallel with the magnetic moments 11 and 12 of the pining layers. When an external magnetic field is applied along the sensing direction 70, the magnetic moment of one magnetoresistive element tends to be parallel with the external field and the pinned layer, thus its resistance will be reduced. Meanwhile, the magnetic moment of the other magnetoresistive element tends to be anti-parallel with the pinned layer, so that its resistance will be increased, resulting in the push-pull output $V_{OUT}$ ($V_{OUT}=V_{Bridge}$ in all remaining diagrams). The output curve is shown in FIG. 4.

Figure 8:
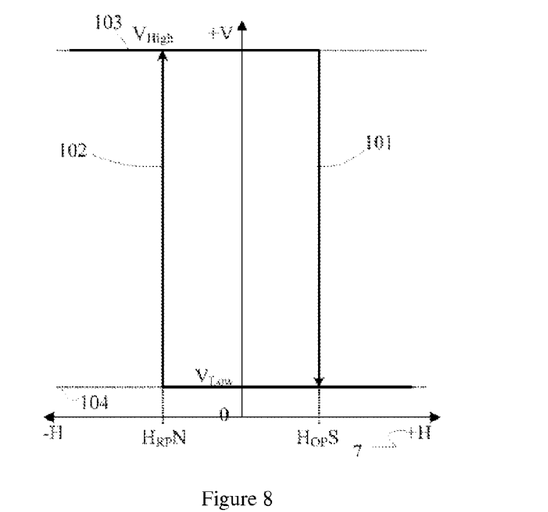
FIG. 8 is a graph showing the relationship between magnetoresistive bipolar switch sensor output voltage and the applied magnetic field.
Figure 9:
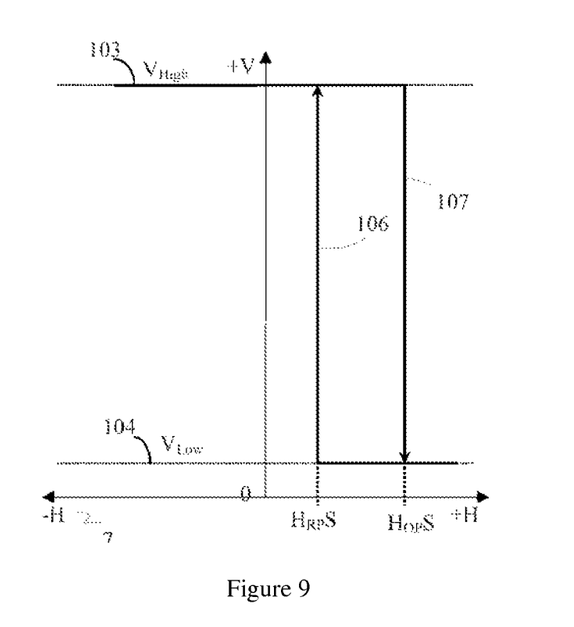
FIG. 9 is a graph showing the relationship between the output voltage and the applied magnetic field for a unipolar magnetoresistive switch sensor.
Figure 11:
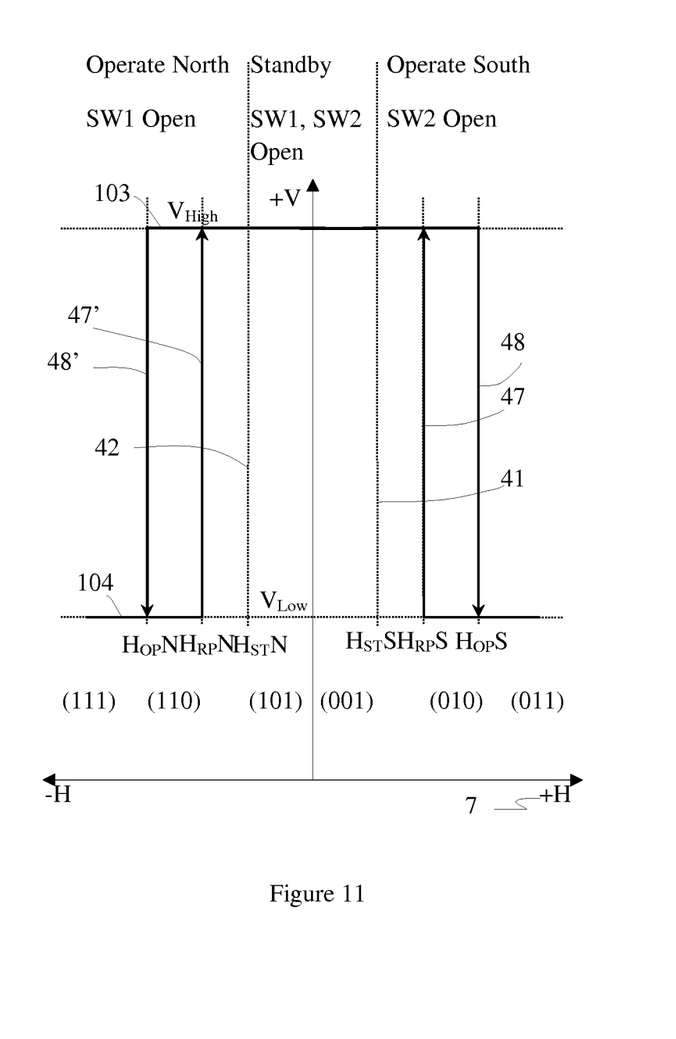
FIG. 11 is a graph showing the relationship between the output voltage and the applied magnetic field of an omnipolar magnetoresistive switch sensor.

The corresponding ASIC Chip 13 is connected to the push-pull half-bridge in order to provide pa steady voltage $V_{DD}$ ($V_{Bias}$ in remaining figures), and to convert the push-pull half-bridge output voltage signal is converted to a switching signal. ASIC chip 13 can be varied according to different technical requirements of different switch signal output signals. ASIC chip 13 can be configured to output a bipolar switching signal as shown in FIG. 8, a unipolar signal as shown in FIG. 9 or an omnipolar switching signal as shown in FIG. 11.

The foregoing example and FIG. 1, FIG. 2, and FIG. 3, are provided as detailed background information, and they come from Chinese Patent Application No. 201110125153.5, which is herein included for reference.

Figure 4:
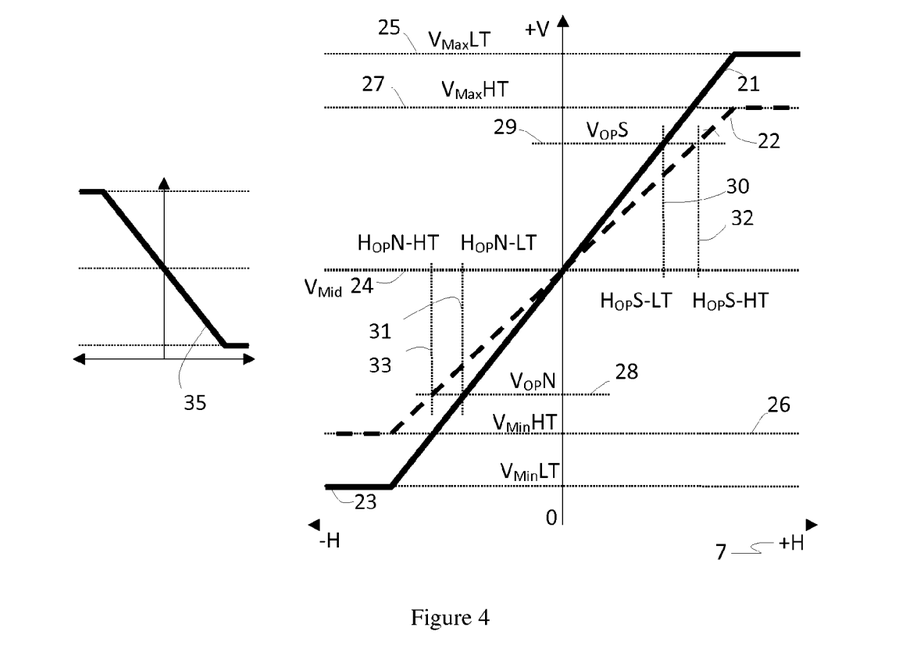
FIG. 4 is a plot of the output voltage as a function of applied magnetic field of a push-pull half-bridge magnetoresistive sensor measured at two different temperatures.

At high and low temperatures in both cases, the relationship between the push-pull half-bridge output voltage and the applied magnetic field between the curves shown in FIG. 4, Where the present embodiment magnetoresistance switch sensor the high temperature and low temperature range limits operation. In this example, the high temperature is 100° C., denoted HT; the low temperature is 0° C., denoted LT. In FIG. 4, curve 35 corresponds to that in FIG. 2, but the curve in FIG. 4 but with a 180 degree rotation of the element pinning direction with respect to the sensing axis 7. As a result, first magnetoresistive element 11 of the push-pull half-bridge has a magnetoresistive transfer curve with negative slope, and second magnetoresistive element 12 of the push-pull half-bridge has a magnetoresistive transfer curve with positive slope, so in FIG. 4 push-pull half-bridge output, $V_{Bridge}$ transfer curve, is balanced at midpoint $V_{Mid}$ 24, and $V_{Bridge}$ due to this relationship has a positive slope with respect to applied magnetic field.

Push-pull half-bridge output voltage at low temperatures $V_{Bridge}$ is indicated by the solid line curve 21, from curve 21 we can see output 20, the output voltage $V_B$ridge has the minimum $V_{Min}$ LT 23 and it gradually increase to the maximum $V_{Max}$ LT 25. First push-pull half-bridge magnetoresistive element 11 and the second magnetoresistive element 12 having a negative temperature coefficient of resistance (TCR: Temperature Coefficient of Resistance) and the corresponding negative temperature coefficient resister Sensitivity (TCRS: Temperature Coefficient of Resistance Sensitivity). When using a push-pull bridge structure, the corresponding temperature coefficient voltage sensitivity (TCV) is −1000 ppm/° C. This means that over the 100 C temperature difference, the VBridge would change −10% for a fixed $V_{bias}$ and Applied Magnetic Field 7. The high temperature curve for $V_{Bridge}$ is plotted as dashed curve 22, and Curve 22 goes from a minimum value of $V_{Min}$ HT 26 to a maximum value of $V_{Max}$ HT 27. At half of $V_{bias}$ is the midpoint of the curve is, $V_{Mid}$ 24. A typical value for $V_{bias}$ is 1 Volt, so $V_{Mid}$ is 0.5 V.

The output of the comparator circuit described below depends on two voltage input signals at its input, which is a voltage signal in FIG. 4 push-pull half-bridge 87 provides an output voltage $V_{Bridge}$, another voltage signal is provided by the internal voltage reference circuit, reference voltage $V_{Ref}$. The value of $V_{Ref}$ is controlled by Digital Control circuitry described later. The value of $V_{Ref}$ is controlled by Digital Control circuitry described later. One possible value for $V_{Ref}$ is shown in FIG. 4 as 29, Voltage Operate Point South ($V_{OP}S$), another possible value for $V_{Ref}$ is 28, shown in FIG. 4, Voltage Operate Point North ($V_{OP}N$). The low temperature curve for $V_{Bridge}$ 21, crosses the voltage level $V_{OP}S$ 29 at Applied Magnetic Field value $H_{OP}S$-LT 30; it crosses the voltage level $V_{OP}N$ 28 at Applied Magnetic Field value $H_{OP}N$-LT 31. The high temperature curve for $V_{Bridge}$ 22, crosses the voltage level $V_{OP}S$ 29 at Applied Magnetic Field value $H_{OP}S$-HT 32; it crosses the voltage level $V_{OP}N$ 28 at Applied Magnetic Field value $H_{OP}N$-HT 33.

Thus, the circuit switching action of the comparator happens at Applied Magnetic Fields of increasing absolute value in proportion to the operating temperature of the magnetoresistive bridge sensor. This is called "temperature dependence of output" and is usually an undesirable effect for sensing applications.

Figure 5:
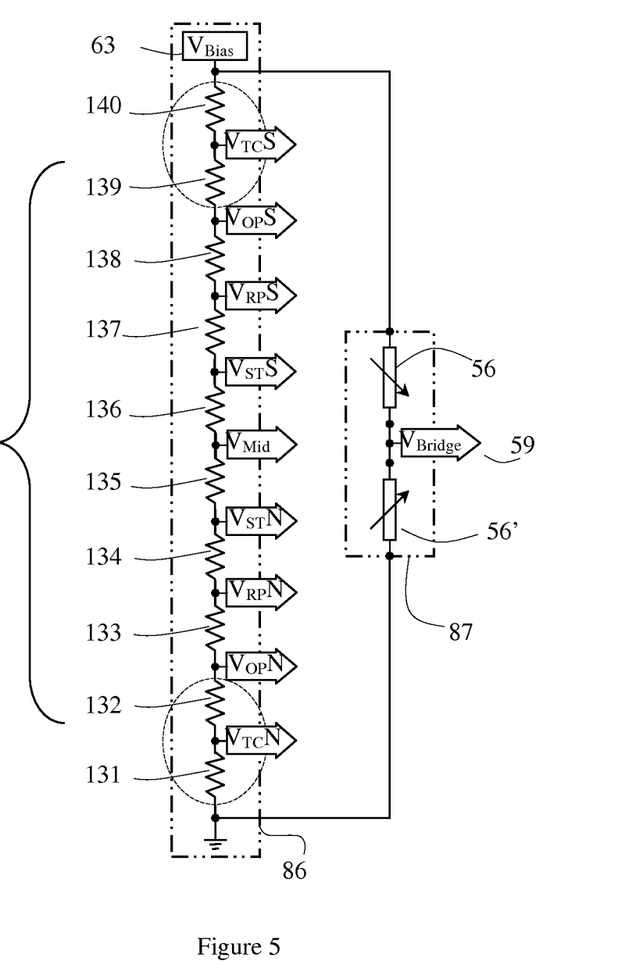
FIG. 5 is a schematic diagram of a reference voltage circuit used for the bridge circuit simulation.

A detailed circuit schematic of the temperature compensation and push-pull bridge circuit is shown in FIG. 5. The right half of the bridge is formed as a push-pull half bridge magnetoresistive sensor enclosed by the dashed box 87. This half bridge has two magnetoresistors, 56 and 56' with characteristics that result in output 59, $V_{Bridge}$, following the curve 21 in FIG. 4. The left half of the bridge is set up as a voltage divider, enclosed by dotted line 86, made of a series of 10 resistors 131-140 and these resistors 131-140 values do not change with magnetic field; it is on a circuit chip represented by dashed outline 86. Internal reference circuit constitutes a half-bridge. Internal reference circuit 86 and push-pull half-bridge 87 form a full bridge. Internal voltage reference circuit 86 includes 7 voltage outputs, and these 7 voltage outputs output 7 different voltage signals, inside the circuit 86, there are 9 Voltage Outputs available from the left side. Of these, 6 are used as switching thresholds: Voltage Operate Point South ($V_{OP}S$), Voltage Reset Point South ($V_{RP}S$), Voltage Standby Threshold South ($V_{ST}S$), Voltage Standby Threshold North ($V_{ST}N$), Voltage Reset Point North ($V_{RP}N$), Voltage Operate Point North ($V_{OP}N$), and are taken from connection nodes as shown in FIG. 5; Another output is for Voltage Midpoint ($V_{Mid}$). The two dashed boxes 86 and 87 have components that may be integrated onto the same silicon chip. Or 87 could be one or more separate chips containing magnetoresistors. Wire bonds and other methods well known in the art are used to make electrical connection from one chip to another when needed. The entire bridge is powered between Ground and $V_{Bias}$ 63, and $V_{Bias}$ 63 is a fixed voltage controlled by circuitry that is described later in this patent application.

Unipolar, bipolar and omnipolar are three types of magnetoresistive switches have different behavior and values for $V_{Ref}S$ and magnetic field switching values. Table 1 below summarizes the names and values for thresholds. Note that the values shown are merely a representative example and can be tuned to meet specific requirements of a given application or user. This generality holds true so long as the Applied Field values are within the active, that is non-saturated, range of the magnetoresistive sensing elements 11 and 12, and the $V_{Ref}$ are less than 63, $V_{Bias}$. Take the Bipolar values for example. $H_{OP}S$ is set to be 59% of Vbias. Suppose $V_{Bias}=1.0$ Volts, then $H_{OP}S$ is 590 mV. This switching occurs at an applied field value of +30 Oe.

TABLE 1

Bipolar, unipolar and omnipolar type magnetoresistive switch sensors with $V_{Bias}$ corresponding reference voltage and magnetic field strength

| Output Type | Threshold Name | Variable Name | Voltage Reference Name | Room Temperature Voltage (% × $V_{Bias}$) | Voltage Value ($V_{Bias}$ = 1 V) (mV) | Magnetic Field Strength (Oe) |
|---|---|---|---|---|---|---|
| Bipolar | south magnetic field operate point | $H_{OP}S$ | $V_{OP}S$ | 59.0 | 590 | +30 |
| Bipolar | north magnetic field release point | $H_{RP}N$ | $V_{RP}N$ | 41.0 | 410 | −30 |
| Unipolar | south magnetic field operate point | $H_{OP}S$ | $V_{OP}S$ | 59.0 | 590 | +30 |
| Unipolar | south magnetic field release point | $H_{RP}S$ | $V_{RP}S$ | 56.0 | 560 | +20 |
| Omnipolar | south magnetic field operate point | $H_{OP}S$ | $V_{OP}S$ | 59.0 | 590 | +30 |
| Omnipolar | south magnetic field release point | $H_{RP}S$ | $V_{RP}S$ | 56.0 | 560 | +20 |
| Omnipolar | south standby threshold magnetic field | $H_{ST}S$ | $V_{ST}S$ | 53.6 | 536 | +12 |
| Omnipolar | north standby threshold magnetic field | $H_{ST}N$ | $V_{ST}N$ | 46.4 | 464 | −12 |
| Omnipolar | north magnetic field release point | $H_{RP}N$ | $V_{RP}N$ | 44.0 | 440 | −20 |
| Omnipolar | north magnetic field operate point | $H_{OP}N$ | $V_{OP}N$ | 41.0 | 410 | −30 |

Through a simple linear relationship, in FIG. 4 it can be seen the output voltage $V_{OUT}$ and magnetic field have a linear relationship curve 21 from the magnetic field in units of Oe can be converted into a percentage of $V_{Bias}$, as shown in Table 1, column 5; Table 1 column 6 "voltage value (mV)($V_{Bias}$=1.0V)" shows the condition $V_{Bias}$=1 V under this circumstance, the voltage value changes with differing reference voltage output. It is important to notice that $V_{Bias}$ is not necessarily fixed at 1V, that is just a typical value. Table 1 column 7 is a compilation of necessary switch sensor magnetic field value, with typical units of Oe.

Figure 6:
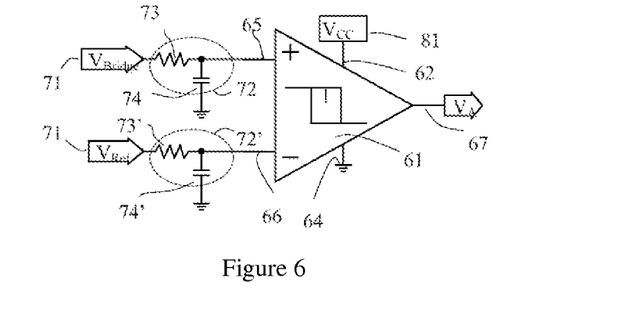
FIG. 6 is an analog filter and a comparator circuit diagram of bipolar and unipolar switch magnetoresistance sensor.

FIG. 6 is a circuit block diagram of the analog filter and comparator stage for the Bipolar and Unipolar type magnetoresistive switch. The comparator 61 is a high-gain amplifier. When comparator 61 output, $V_A$ 67, is H or 1, the output voltage $V_A$ 67, is in the high state. When comparator 61 output, $V_A$ 67, is L or 0, the output voltage $V_A$ 67, is in the low state. The High state occurs when the voltage present at the positive input 65 is greater than the voltage present at negative input 66. The high voltage value for $V_A$ is less than but nearly equal to $V_{CC}$ 81, the low voltage is greater than but nearly equal to ground 64 or 0 volts. The comparator is connected to power supply $V_{CC}$ through its positive power input 62.

The voltage inputs are 71' $V_{Ref}$ that comes from the voltage reference portion 86 of FIGS. 5, and 71 $V_{Bridge}$ from the right side magnetoresistive chip 87. $V_{Ref}$ can be either $V_{OP}$ or $V_{RP}$ depending on the state of a multiplexer MUX1 88 shown in FIG. 7. Each input passes through a standard RC low pass filter 72 and 72'. Each filter has a resistance 73, 73', and a capacitor 74, 74'. The 3 dB roll off frequency is calculated by the usual Frequency $F=1/[(2\pi)*(RC)]$ equation (1)

where R and C are resistance and capacitance in Ohms and Farads, respectively. A typical cutoff frequency for this product is 100 kHz. This filter serves a few purposes: 1) it eliminates high frequency noise signals, 2) it reduces switching "bounce" where the high gain comparator bounces back and forth between its high and low output values when $V_{Ref}$ is equal to or near $V_{Bridge}$.

Figure 7:
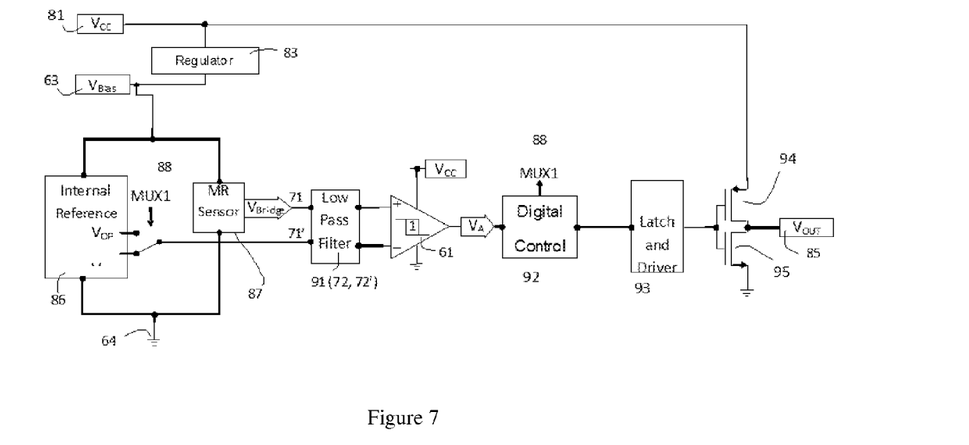
FIG. 7 is a circuit diagram of bipolar and unipolar switch magnetoresistive switch sensors.

The comparator 61 and filter 72, 72' (together labeled Low Pass Filter 91) are part of a larger circuit whose block diagram is in FIG. 7. Power is connected between VCC 81 and Ground 64. Voltage regulator 83 provides a steady analog voltage bias, 63 $V_{Bias}$. Multiplexer 88 MUX1 is a switch that connects one of the reference voltage outputs from 86 Internal Reference circuit to 71' input to the Low Pass Filter 91. The bridge output $V_{Bridge}$ is connected to input 71 of Low Pass Filter 91. Low-pass filter circuit 91 output terminal and the input of the comparator 61 are electrically connected. The comparator 61 utput $V_A$ is connected to the input of Digital Control Circuit 92. There are two outputs from Digital Control Circuit 92: one is MUX1, 88, the other is a connection to Latch and Driver circuit 93. This, in turn, drives the output stage. The output stage has a dual transistor 94 and 95 which is capable of switching rapidly without large power use. The circuit output is at 85, $V_{OUT}$.

A digital control system 92 and a set of "logical operating modes" are two parts of the present invention. A "logical operating mode" has the following properties:
1) an abstract logical or binary representation in "1"s and "0"s,
2) an electronic circuit representation of the same mode, such as in digital memory,
3) a set of "electronic operations" that occur as a result of being in a particular "logical operating mode". Most interesting digital control systems have more than one "logical operating mode." When this is the case, additional requirements are
4) a well defined and finite set of distinct modes, and
5) a well defined and self consistent set of "trigger conditions" that, when they are realized, cause the logical operating mode to switch from one to another well defined mode.

Digital Control Circuit 92 contains the electronic representation of the binary mode names and the logical programs that carry out required "electronic operations" upon entering a logical mode, and also the programs that carry out switching from one mode to another upon realization of the "trigger conditions".

FIG. 8 shows Output Voltage vs. Applied Magnetic Field for Bipolar magnetic switch sensors. The magnetoresistive switch circuit shown in FIG. 7 can put out two forms of output vs. an applied magnetic field 7. The first form, Bipolar, is shown in FIG. 8. The output switches between two voltage values, $V_{HIGH}$ 103, and $V_{LOW}$ 104. The switching transitions 101 and 102 happen at magnetic field values $H_{OP}S$ and $H_{RP}N$. For this behavior, the digital control circuit 92 must use MUX1 88 to select $V_{OP}S$ and $V_{OP}N$ as the two reference voltages passed along to the comparator. A logic truth table is shown below in the top half of Table 2 for the Bipolar Switch operation.

FIG. 9 shows Output Voltage vs. Applied Magnetic Field for Unipolar switch. The second possible form of output from the magnetoresistive switch circuit in FIG. 7 is the Unipolar form, shown in FIG. 9. The output switches between two voltage values, 103 $V_{High}$, and 104 $V_{Low}$. The switching transitions 106 and 107 happen at magnetic field values $H_{OP}S$ and $H_{RP}S$. For this behavior, the digital control circuit 92 must use MUX1 88 to select $V_{OP}S$ and $V_{OP}S$ as the two reference voltages passed along to the comparator 61. A logic truth table is shown below in the bottom half of Table 2 for the Unipolar Switch operation.

TABLE 2 bipolar and unipolar magnetoresistive sensor ASIC digital circuit switch truth table.

| Symbol | $V_{Bridge}$ Bridge Voltage | VA trigger condition | (Mux1) V reference select | $V_{OUT}$ output voltage |
|---|---|---|---|---|
| Bipolar Switch | | | | |
| Power on default | =1/2 $V_{bias}$ | 1 | $V_{OP}$ | 1 |
| $H_{OP}S$ | >$V_{OP}S$ | 1→0 | →$V_{RP}S$ | →0 |
| $H_{RP}N$ | <$V_{RP}N$ | 1 | →$V_{OP}N$ | →1 |
| Unipolar Switch | | | | |
| Power on default | =1/2 $V_{bias}$ | 1 | $V_{OP}$ | 1 |
| $H_{OP}S$ | >$V_{OP}S$ | 1→0 | →$V_{RP}S$ | →0 |
| $H_{RP}S$ | <$V_{RP}S$ | 1 | →$V_{OP}S$ | →1 |

When the behavior of Voltage A (VA) matches the trigger condition, MUX1 maintains, or switches to, the indicated reference voltage ($V_{REF}$)
The character "→" indicates a change in value.

The "logical operating modes" in the circuit examples so far are limited to two modes, "0" and "1" or "high" and "low". The "electronic operations" that occur upon entering these modes are: Digital Control Circuit 92 uses MUX1 88 to switch to a new Reference Voltage. The "trigger conditions" are defined in terms of observing the output of comparator 61 from High to Low, or Low to High. These trigger conditions are directly related to the externally applied magnetic field because the MR Sensor 87 $V_{Bridge}$ is one of the comparator 61 input signals. These are called "applied magnetic field trigger conditions".

Figure 10:
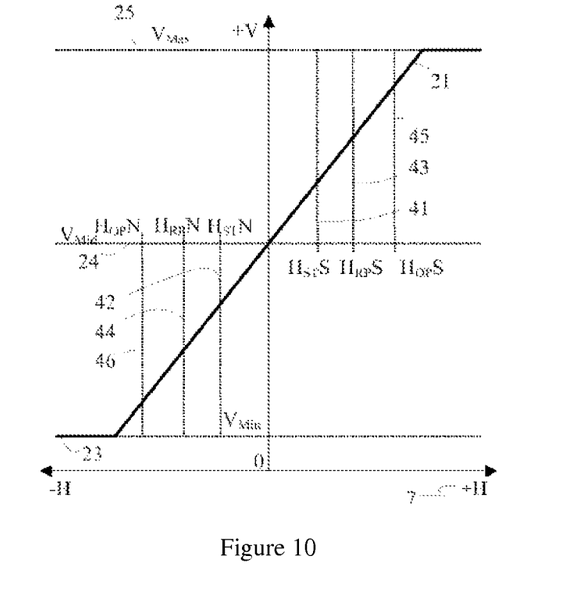
FIG. 10 is a diagram showing the relationship between the output voltage and the applied magnetic field of a push-pull bridge sensor.

FIG. 10 is a graph showing the relationship between the output voltage and the applied magnetic field push-pull between the resistor bridge. The output $V_{Bridge}$ 59 from the tunneling magnetoresistive bridge sensor 87 is plotted as curve 21. This is the same curve as in FIG. 4, but only one temperature is shown, and more switching field thresholds are shown. Curve 21 is antisymmetrical about the H=0 axis. The voltage midpoint, $V_{Mid}$ 24, is approximately half way between $V_{Max}$ 25 and $V_{Min}$ 23. Field values at which comparators switch are indicated as H Standby Threshold South $H_{ST}S$ 41, H Reset Point South $H_{RP}S$ 43, H Operate South $H_{OP}S$ 45, H Standby Threshold North $H_{ST}N$ 42, H Reset Point North $H_{RP}N$ 44, H Operate Point North $H_{OP}N$ 46.

FIG. 11 shows the $V_{OUT}$ vs. Output Voltage vs. Applied Magnetic Field 7 for of the Omnipolar magnetoresistive switch. This circuit uses the same analog bridge and reference voltage stages as the Bipolar and Unipolar. However, a different comparator and logic circuits are needed, they are shown below in FIGS. 12 and 13. The output switches between two voltage values, 103 $V_{High}$, and 104 $V_{Low}$. Switching transitions 47 and 48 happen at magnetic field values $H_{OP}S$ and $H_{RP}S$. Switching transitions 47' and 48' happen at magnetic field values $H_{OP}N$ and $H_{RP}N$. For this behavior, the digital control circuit 192 must use MUX1 188 to select $V_{ST}S$, $V_{RP}S$, or $V_{OP}S$ as the reference voltages passed along to the comparators; and MUX2 189 to select $V_{ST}N$, $V_{RP}N$, or $V_{OP}N$ as the reference voltages passed along to comparator 61.

The total magnetic field range is divided into six logical operating modes: Operate North, Reset North, Standby North, Standby South, Operate South, and Reset South. The Standby modes occur at fields between $H_{ST}N$ and $H_{ST}S$. These standby modes have inventive properties. Specifically, they have new "electronic operations" that save power by actuating switches SW1 170 and SW2 270. This is in addition to causing MUX1 188, and MUX2 189, to select new Reference Voltages. The digital labels [(111), (110), (101), (001), (010), (011)] for distinct logical operating modes for the 6 field regions are shown at the bottom of FIG. 11 in their corresponding field range. A logic truth table is shown below Table 4 for the Omnipolar Switch operation. The "electronic operations" of MUX 1, MUX 2, SW 1, SW 2; and, "trigger conditions" needed to switch from one mode to another, are shown in the table of logic modes in Table 5. A table of current consumption vs. operation mode is in Table 4.

TABLE 3

Omnipolar switch sensor truth table.

| Symbol | $V_{Bridge}$ | Trigger Condition $V_A$ | $V_B$ | VS (Mux1) | VN (Mux2) | SW1 | SW2 | $V_{OUT}$ | Operation Mode |
|---|---|---|---|---|---|---|---|---|---|
| Standby (power on default) | =½vbias | 0 | 0 | 001 | 101 | 0 | 0 | 1 | Standby |

TABLE 3-continued

Omnipolar switch sensor truth table.

| Symbol | Trigger Condition $V_{Bridge}$ | $V_A$ | $V_B$ | VS (Mux1) | VN (Mux2) | SW1 | SW2 | $V_{OUT}$ | Operation Mode |
|---|---|---|---|---|---|---|---|---|---|
| S Out of standby | $>V_{ST}S$ | 0→1 | 0 | →011 | →001 | →1 | 0 | 1 | South pole switch |
| BOPS | $>B_{OP}S$ | 1 | 0 | →010 | 001 | 1 | 0 | →0 | mode |
| BRPS | $<B_{RP}S$ | 1→0 | 0 | →011 | 001 | 1 | 0 | →1 | |
| Re-standby | $<V_{AT}S$ | 0 | 0 | →001 | →101 | →0 | 0 | 1 | Standby |
| Standby | $V_{ST}N$ $<V_{Bridge}$ $<V_{ST}S$ | 0 | 0 | 001 | 101 | 0 | 0 | 1 | |
| N Out of standby | $<V_{ST}N$ | 0 | 0→1 | →101 | →111 | 0 | →1 | 1 | North pole Switch |
| BOPN | $<B_{OP}N$ | 0 | 1 | 101 | →110 | 0 | 1 | →0 | mode |
| BRPN | $>B_{RP}N$ | 0 | 1→0 | 101 | →111 | 0 | 1 | →1 | |
| Re-standby | $>V_{ST}N$ | 0 | 0 | →001 | →101 | 0 | →0 | 1 | Standby |

Table 3, when the voltage A and B ($V_A$ and $V_B$) in columns 3 and 4 match the trigger conditions, MUX1 and MUX2 maintain or switch to the state shown in columns 5 and 6. In addition, SW1 and SW2 maintain or switch to the conditions shown in columns 7 and 8. The "→" character represents a change of values. In the SW1 and SW2 columns, "0" and "1" denote the "open switch" and "closed switch" states.

TABLE 4

MUX logic symbols related to reference voltage values for Omnipolar Switch.

| Mux1 | $V_{Ref}S$ | Mux2 | $V_{Ref}N$ |
|---|---|---|---|
| 001 | $V_{ST}S$ | 000 | — |
| 010 | $V_{RP}S$ | 101 | $V_{ST}N$ |
| 011 | $V_{OP}S$ | 110 | $V_{RP}N$ |
| 100 | — | 111 | $V_{OP}N$ |

Do not need to care about states 101, 000 and 100, in the two stage floating output design.

Figure 12:
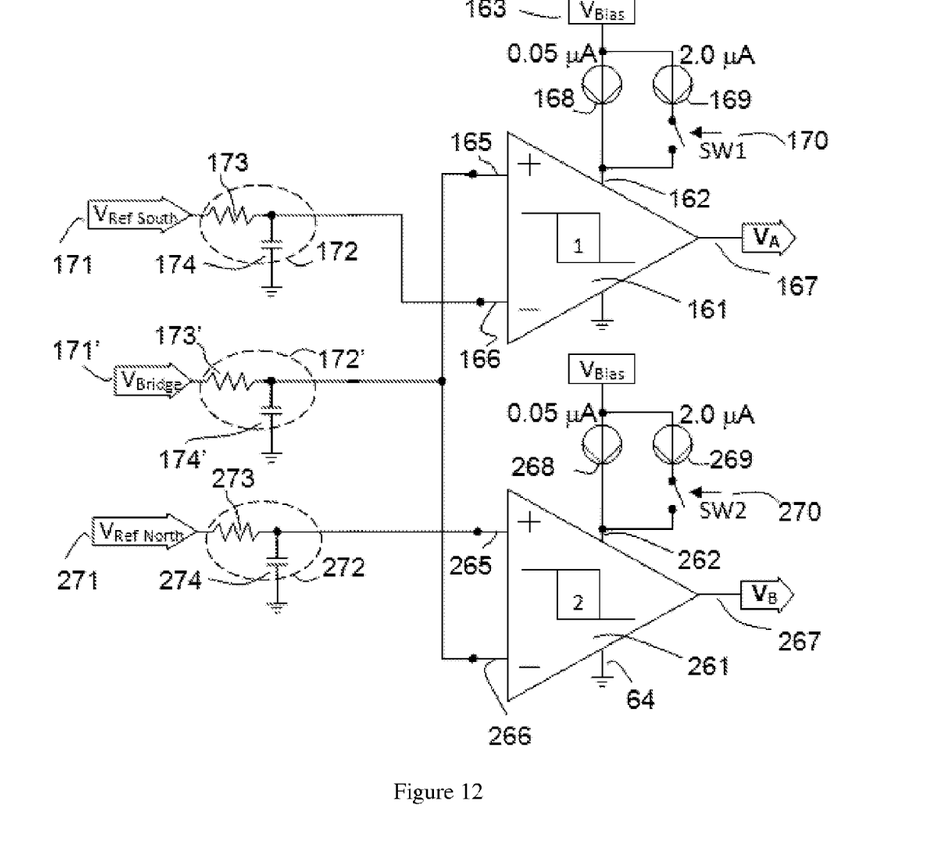
FIG. 12 illustrates a circuit diagram of a preferred implementation of the present invention of the analog filters and comparators of an omnipolar magnetoresistive switch sensor.

A circuit diagram of the Analog Filter and Comparator for the Omnipolar magnetoresistive switch is shown in FIG. 12. It performs similar functions to the comparator circuit in FIG. 6. But an additional comparator is needed for Omnipolar operation, and power saving features are added.

The left side of FIG. 12 shows an analog input filter. South pole reference voltage $V_{REF}$ 171 is connected to the low-pass filter 172, a low-pass filter 172 includes a resistor 173 and a capacitor 174. The output of Low pass filter 172 is electrically connected to negative input 166 of the comparator 161. $V_{Bridge}$ 171' is connected to the low-pass filter 172', a low-pass filter 172 includes a resistor 173' and the capacitor 174'. Low-pass filter 172' is electrically connected to the negative input 266 of the second comparator 261 and to the first comparator 161 positive input 165. $V_{Bridge}$ opposite polarity and electrical connection between the comparator, make $V_{OUT}$ versus applied magnetic field and having anti-symmetry. North pole reference voltage $V_{REF}$ 271 is electrically connected to a low pass filter 272, low pass filter 272 includes a resistor 273 and a capacitor 274, a filter 272 is electrically connected to the output of the second comparator 261 positive input 265.

Two comparator implementations of the present embodiment are given, a first Comparator 161, and a second comparator 261. The first comparator 161 has positive input 165 and negative input 166. It has output $V_A$ at 167. It draws power between $V_{Bias}$ 163 and Ground 64. Positive power supply 162 carries electrical current from current supplies 168 and 169, which supply 0.05 µA and 2.0 µA, respectively. The first switch SW1 170 determines whether the current supply 169 is connected or not. Current supply 168 is always connected. The second comparator 261 has positive input 265 and negative input 266. It has output $V_B$ at 267. It draws power between $V_{Bias}$ 263 and Ground 64. Positive power supply 262 carries electrical current from current supplies 268 and 269, which supply 0.05 µA and 2.0 µA, respectively. The second switch SW2 270 determines whether the current supply 269 is connected or not. Current supply 268 is always connected.

The current supply first switch SW1 and second switch SW2 provide a way to reduce the amount of electrical power consumed during operation. Table 5 below shows totals of current consumed in various modes.

TABLE 5

Current consumption in the modes of Omnipolar type magnetoresistive switch.

| Magnetic field (Oersted) | Switch 1 (SW1) | Switch 2 (SW2) | Total I in comparator (uA) |
|---|---|---|---|
| Magnetic field South | | | |
| H < 12 | open | open | 0.1 uA |
| H > 12 | connect | open | 2.05 uA |
| H < 30 ($B_{OP}S$) | | | |
| H falling to 20 ($B_{RP}S$) | | | |
| Magnetic field North | | | |
| H < 12 | open | open | 0.1 uA |
| H > 12 | open | connect | 2.05 uA |
| H < 30 ($B_{OP}N$) | | | |
| H falling to 20 (B + N) | | | |

Figure 13:
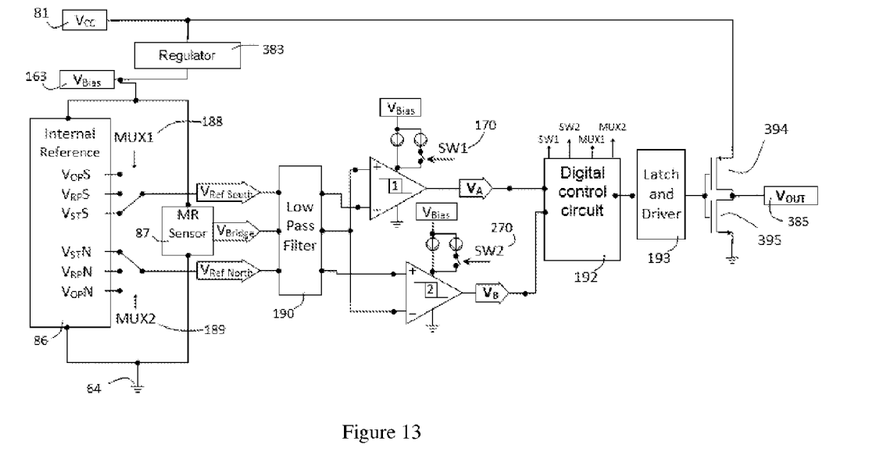
FIG. 13 is a circuit diagram of an omnipolar magnetoresistive sensor switch according to a preferred embodiment of the present invention.

FIG. 13 shows a circuit diagram of a preferred implementation of an omnipolar low-power magnetoresistive switch sensor of the present invention. It draws electrical power between Ground 64 and $V_{CC}$ 81. Regulator 383 provides a stable and lower voltage power supply $V_{Bias}$ 163 to internal voltage reference circuit 86 and Magnetoresistive Bridge 87. Multiplexer MUX1 188 is a switch that connects one of the reference voltage outputs from the South end of Internal Reference circuit 87 to the $V_{Ref}$ South 71' input to the Low Pass Filter 190. The bridge output $V_{Bridge}$ is connected to input 171' of Low Pass Filter 190. Multiplexer MUX2 189 is a switch that connects one of the reference voltage outputs from the North end 87 of Internal Reference circuit to the $V_{REF}$ South 271 input to the Low Pass Filter 190.

Figure 14:
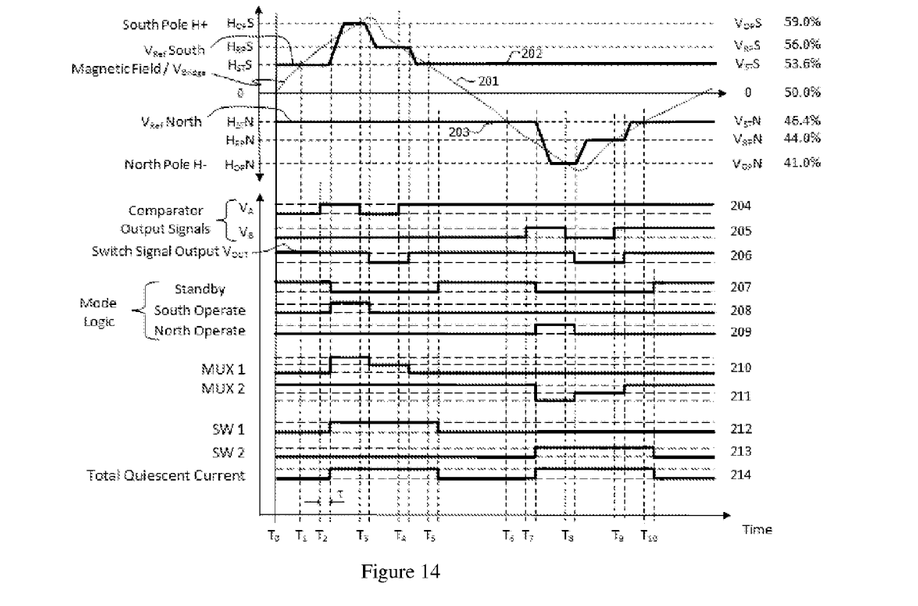
FIG. 14 is a timing chart for an omnipolar magnetoresistive switch sensor operating in accordance with a preferred embodiment of the present invention.

The two comparator outputs $V_A$ and $V_B$ are connected to the input of Digital Control Circuit 192. There are five outputs from Digital Control Circuit 192 (MUX1 188; MUX2 189; SW1 170; SW2 270) the Latch, and 5 output driver circuit 193. This, in turn, drives the output stage. The output stage has a dual transistors 394, 395, which are capable of switching rapidly without large power use. The circuit output is at 385, $V_{Out}$. The response of digital control circuit 192 to signals $V_A$ and $V_B$ at its input are detailed in Tables 4 and 5, and in the timing diagram in FIG. 14. A signal vs. time diagram for the Omnipolar Magnetoresistive Switch is shown in FIG. 14. The time axis is unitless and not precisely linear. It is scaled in a way to aid explanation, not to provide quantitative detail. Times are labeled $T_0$, $T_1$, . . . $T_{10}$. There are two sets of analog scales. The upper analog scale has analog signals coming from the $V_{Bridge}$, and $V_{Ref}$. The lower analog scale shows digital values in the vertical direction.

The output from the magnetoresistive bridge 87, $V_{Bridge}$ is plotted in the dashed curve 201. It represents a signal that would be present as a magnet moves by the sensor and giving a quasi-sinusoidal Applied Magnetic Field signal to the magnetoresistive bridge. $V_{Bridge}$ is directly proportional to the Applied magnetic Field, so these two curves are plotted on the same set of vertical axes as 201. The left axis shows 7 Applied Magnetic Field values. The right vertical axis shows reference voltage values both as threshold labels and as percentage of $V_{Bias}$. The upper half of the plot has positive (South) values for magnetic field, and positive values for $V_{Bridge}$. The lower half of the plot has negative (North) values for magnetic field, and negative values for $V_{Bridge}$.

$V_{REF}$ South is plotted as solid curve 202. It has three steady state values $V_{ST}S$, $V_{OP}S$, and $V_{RP}S$. $V_{REF}$ North is plotted as solid curve 203, which has three steady state levels $V_{ST}N$, $V_{OP}N$, and $V_{RP}N$. There is a measurable time for curves 202 and 203 to switch from one state to another. These two signals are taken from the Voltage reference circuit 86. MUX 1, whose digital state vs. time is plotted in solid curve 210, selects one of the three South $V_{REF}$ values: $V_{ST}S$, $V_{OP}S$, or $V_{RP}S$. MUX 2, whose digital state vs. time is plotted in solid curve 211, selects one of the three North $V_{REF}$ values: $V_{ST}N$, $V_{OP}N$, or $V_{RP}N$. These digital states are not voltage levels, but rather a representation of which $V_{REF}$ to which they are to be connected. The output connections of the first comparator and the second comparator carry voltage signals $V_A$ and $V_B$, respectively. These two digital levels are plotted vs. time as solid curves 204 and 205 that switch between digital levels near Ground and $V_{BIAS}$. The external output connection 385 of the circuit carries voltage level $V_{OUT}$ whose signal vs. time is plotted as solid curve 206. The $V_{OUT}$ switches between levels near Ground and $V_{CC}$. There are three mode logic lines whose output vs. time are plotted as solid curves: Standby 207, South Operate 208, and North Operate 209. The states of Switch 1 170 (SW 1) and Switch 2 270 (SW 2) are plotted vs. time as solid curves 212 and 213. A high level on these curves means the switch is closed and extra current is flowing to the power terminal of that comparator. The total Quiescent Current used by the circuit is plotted vs. time as solid curve 214. This curve goes between values of 0.1 µA and 2 µA. When the circuit is in one of the active North or South switching modes, one but not both of SW 1 or SW 2 is open. When in "Standby" mode, both SW 1 and SW 2 are open. At no time are both SW 1 and SW 2 closed simultaneously.

Now, a description of the entire circuit action vs. time using the example signal provided as $V_{Bridge}$ curve 201. The logic design was described above in Tables 3 and 4. At $T_0$, $V_{Bridge}$=0 Volts; the mode is Standby (001), $V_{OUT}$=High. $V_{Bridge}$ increases to and at $T_1$ crosses $V_{ST}S$ which is the current voltage threshold value on the first Comparator. This causes $V_A$ to switch to 1 after a time dT=$T_2$-$T_1$ has passed. dT is relatively long, say 1 millisecond, because the power to the first Comparator is low, which causes signal delays. Subsequent switching events happen within a time t, which is set by the logic circuit clock frequency, f. At time $T_2$+t, the following occur: logic Standby line 207 goes 0 to 1, South Operate mode 208 goes 0 to 1, North Operate Mode 209 is 0, MUX 1 210 selects $V_{OP}S$, SW1 212 closes. The circuit is in South Operate Mode (011).

$V_{Bridge}$ continues to increase and at time $T_3$ crosses $V_{OP}S$, the present voltage threshold value on the first comparator indicated by curve 202. This causes $V_A$ to switch to 0. At the next clock cycle within time □, at time $T_3$+□, the following occur: output 206 goes Low, Standby line 207 is 0, South Operate mode 208 goes from 1 to 0, North Operate Mode is 0, MUX 1 210 selects $V_{RP}S$ causing curve 202 to shift towards $V_{RP}S$. The circuit is in South Operate Mode (010).

$V_{Bridge}$ at some time begins to decrease and at time $T_4$ crosses curve 202 at value $V_{RP}S$, the present voltage threshold value on Comparator 1. This causes $V_A$ to switch 0 to 1. At the next clock cycle within time t, at time $T_4$+t, the following occur: 206 Output goes Low to High, logic (Standby line 207 is 0, South Operate mode 208 is 0, North Operate Mode is 0), MUX 1 210 selects $V_{ST}S$ causing curve 202 to shift towards $V_{ST}S$. The circuit is in South Operate Mode (011).

$V_{Bridge}$ at some time begins to decrease and at time $T_5$ crosses curve 202 at value $V_{RP}S$, the present voltage threshold value on the first comparator. This causes $V_A$ to switch 0 to 1. At the next clock cycle within time t, at time $T_5$+t, the following occur: 206 Output goes Low to High, Standby line 207 goes from 0 to 1, South Operate mode 208 is 0, North Operate Mode is 0, MUX 1 212 closes. The circuit is in Standy Mode (011).

$V_{Bridge}$ continues to decrease and at time $T_6$ crosses curve 203 at value $V_{ST}N$, the present voltage threshold value on the second Comparator. This causes second comparator output $V_B$ 205 to switch from 0 to 1 at time $T_7$. This comparator action takes relatively long dt=$T_7$-$T_6$, say 1 millisecond, because the power to the second Comparator is low At $T_7$+t, the following occur: Output 206 is High, Standby line 207 goes from 1 to 0, South Operate mode 208 is 0, North Operate Mode 209 goes from 0 to 1. MUX 2 211 switches to $V_{OP}N$ causing $V_{Ref}$ North curve 203 to shift towards $V_{OP}N$. SW 2 213 closes, providing more power current to the second comparator. The circuit is in North Operate Mode (111).

$V_{Bridge}$ continues to decrease and at time $T_8$ and crosses curve 203 at value $V_{OP}N$, the present voltage threshold value on the second comparator. This causes the second comparator output $V_B$ 205 to switch from 1 to 0. At $T_7$+t, the following occur: output 206 switches from High to Low, Standby line 207 is 0, South Operate mode 208 is 0, North Operate Mode 209 goes from 1 to 0. MUX 2 211 switches to $V_{RP}N$ causing $V_{Ref}$ North curve 203 to shift towards $V_{RP}N$. The circuit is in North Operate Mode (110).

$V_{Bridge}$ begins to increase and at time $T_9$ crosses curve 203 at value $V_{RP}N$, the present voltage threshold value on the second comparator. This causes the second comparator output $V_B$ 205 to switch from 0 to 1. At $T_9+t$, the following occur: output 206 switches Low to High, logic lines Standby line 207 switches from 0 to 1, South Operate mode 208 is 0, North Operate Mode 209 is 0). MUX 2 21 switches to $V_{ST}N$ causing $V_{Ref}$ North curve 203 to shift towards $V_{ST}N$. The circuit is in North Operate Mode (111).

$V_{Bridge}$ continues to increase and at time $T_{10}$ crosses curve 203 at value $V_{ST}N$, the present voltage threshold value on the second comparator. At the next clock cycle within time t, at time $T_{10}+t$, the following occur: output 206 is High, logic levels Standby line 207 goes from 0 to 1, South Operate mode 208 is 0, North Operate Mode is 0. SW 2 203 closes. The circuit is in Standby Mode (001).

Compared with Chinese patent application number 201110125153.5, this low power magnetoresistive switch sensor has the following advantages:

1) Provides a filtering means for reducing the noise of a switch;
2) The method described for reducing power, provides only a slight decrease in operating frequency in the circuit.

It should be understood that the above detailed description of the technical solutions used for the present invention are preferred embodiments that are illustrative and not restrictive. One of ordinary skill in the art upon reading the present specification can based on the technical solutions described in the embodiments modify or replace some technical features with equivalent replacements; and such modifications or replacements do not make the revised technical solutions of the various embodiments of the present invention depart from the spirit and scope of the present invention.

The invention claimed is:

1. A magnetoresistive switch sensor comprising:
    an internal reference voltage circuit having a plurality of outputs,
    a multiplexer,
    a magnetoresistive bridge circuit having an output,
    a comparator circuit,
    a power regulator circuit having an output,
    a digital control circuit having inputs, and
    a digital output stage circuit;
    the internal reference voltage circuit being connected to ground and to the output of the power regulator circuit,
    the comparator circuit comprising one or more comparators, being connected to the power regulator circuit and to ground, the comparator circuit having one or more inputs and one or more comparator circuit outputs, the one or more comparator circuit outputs being electrically connected to one of the inputs of the digital control circuit;
    the magnetoresistive bridge circuit being electrically connected to the power regulator circuit and to ground, the magnetoresistive bridge circuit output is connected to one input of the comparator circuit;
    the multiplexer being controlled by the digital control circuit, the multiplexer determining which of the outputs of the reference voltage circuit are electrically connected to one of the comparator circuit inputs;
    the digital control circuit being configured to execute operations based on internal logic states and input signals changes, and having electrical connections to the multiplexer and the digital output stage circuit.

2. The magnetoresistive switch sensor of claim 1 wherein a low pass filter circuit is connected between the reference voltage circuit, the magnetoresistive bridge circuit and the comparator circuit, the low pass filter circuit has inputs connected to the outputs of the magnetoresistive bridge circuit and the outputs of the reference voltage circuit, the low pass filter circuit has outputs connected to the inputs of the comparator circuit, and the low pass filter circuit has a cut-off frequency and is used to attenuate the voltages that have a frequency above the cut-off frequency.

3. The magnetoresistive switch sensor of claim 1 wherein an output voltage $V_{Bias}$ of the power regulator circuit is lower than a supply voltage.

4. The magnetoresistive switch sensor of claim 3 wherein the comparator circuit comprises one or more comparator power switches that determine which current sources are connected to the power terminals of the comparator circuit, the current sources are connected also to the power regulator circuit, and the comparator power switches are controlled by the digital control circuit.

5. The magnetoresistive switch sensor of claim 1 where the digital control circuit is one part of a digital control system.

6. The magnetoresistive switch sensor of claim 5 wherein the digital control system comprises a set of logical operating modes, and applied magnetic field trigger conditions.

7. The magnetoresistive switch sensor of claim 6 wherein the digital control system is configured to create a magnetic field-dependent output having a character of a bipolar switch, unipolar switch, or omnipolar switch.

8. The magnetoresistive switch sensor of claim 1 wherein the magnetoresistive bridge circuit comprises a first magnetoresistive element and a second magnetoresistive element electrically connected to form one push-pull half bridge.

9. The magnetoresistive switch sensor of claim 8 wherein the first magnetoresistive element and the second magnetoresistive element respectively comprises one or more magnetic tunnel junction elements in series or/and in parallel.

10. The magnetoresistive switch sensor of claim 8 wherein the sensitive direction of the push-pull half bridge is parallel to the magnetic moment direction of the pinned layer of the first magnetoresistive element and second magnetoresistive element.

11. The magnetoresistive switch sensor of claim 1 wherein the digital output stage circuit comprises a latch and driver circuit and an output stage, the latch and driver circuit has an input connected to an output of the digital control circuit, and the latch and driver circuit has an output connected to the digital output stage circuit.

12. A magnetoresistive switch sensor comprising:
    a power regulator circuit configured to provide an output voltage $V_{Bias}$ on an output of the power regulator circuit;
    an internal reference voltage circuit connected to ground and the output of the power regulator circuit, the internal reference voltage circuit including a plurality of outputs;
    a magnetoresistive bridge circuit electrically connected to the power regulator circuit and to ground, the magnetoresistive bridge circuit having an output;
    a comparator circuit connected to the power regulator circuit and to ground, the comparator circuit having a sensor signal input, a reference signal input, and an output, the sensor signal input of the comparator circuit being connected to the output of the magnetoresistive bridge circuit;

a multiplexer configured to determine which of the plurality of outputs of the internal reference voltage circuit are electrically connected to the reference signal input of the comparator;

a digital control circuit having a control signal input electrically connected to the output of the comparator circuit, the digital control circuit being configured to receive signals at the control signal input and to execute operations based on internal logic states and the received signals to control the multiplexer; and a digital output stage connected to an output of the digital control circuit.

13. The magnetoresistive switch sensor of claim 12 wherein the output voltage $V_{Bias}$ of the power regulator circuit is lower than a supply voltage.

14. The magnetoresistive switch sensor of claim 13 wherein the comparator circuit comprises one or more comparator power switches that determine which of current source are connected to the power terminals of the comparator circuit, the current sources connected also to the power regulator circuit, the comparator power switches being controlled by the digital control circuit.

15. The magnetoresistive switch sensor of claim 12 where the digital control circuit is one part of a digital control system that has a set of logical operating modes, and applied magnetic field trigger conditions.

16. The magnetoresistive switch sensor of claim 15 wherein the digital control system is configured to create magnetic field-dependent output having the character of a bipolar switch, unipolar switch, or omnipolar switch.

17. The magnetoresistive switch sensor of claim 12 wherein the magnetoresistive bridge circuit comprises a first magnetoresistive element and a second magnetoresistive element electrically connected to form one push-pull half bridge.

18. The magnetoresistive switch sensor of claim 17 wherein the first magnetoresistive element and the second magnetoresistive element respectively comprises one or more magnetic tunnel junction elements in series or/and in parallel.

19. The magnetoresistive switch sensor of claim 17 wherein the sensitive direction of the push-pull half bridge is parallel to the magnetic moment direction of the pinned layer of the first magnetoresistive element and second magnetoresistive element.

20. The magnetoresistive switch sensor of claim 12 wherein the digital output stage circuit comprises a latch and driver circuit and an output stage, the input of the latch and driver circuit is connected to the output of the digital control circuit, the output of the latch and driver circuit is connected to the output stage.

* * * * *

UNITED STATES PATENT AND TRADEMARK OFFICE
CERTIFICATE OF CORRECTION

PATENT NO. : 9,958,512 B2  
APPLICATION NO. : 14/778303  
DATED : May 1, 2018  
INVENTOR(S) : Xiaojun Zhong Page 1 of 1

It is certified that error appears in the above-identified patent and that said Letters Patent is hereby corrected as shown below:

On the Title Page

Item (71), in "Applicant", in Column 1, Line 1, delete "MultiDimensional" and insert --MultiDimension-- therefor Item (30), in "Foreign Application Priority Data", in Column 1, Line 1, delete "2013 1 0090198" and insert --201310090198.2-- therefor Item (30), in "Foreign Application Priority Data", in Column 1, Line 2, delete "2013 1 0097268" and insert --201310097268.7-- therefor Signed and Sealed this  
Twenty-eighth Day of May, 2019

Andrei Iancu  
*Director of the United States Patent and Trademark Office*